United States Patent [19]
Gontowski, Jr.

[11] 4,439,673
[45] Mar. 27, 1984

[54] TWO TERMINAL INTEGRATED CIRCUIT LIGHT-SENSOR

[75] Inventor: Walter S. Gontowski, Jr., Thompson, Conn.

[73] Assignee: Sprague Electric Company, North Adams, Mass.

[21] Appl. No.: 296,748

[22] Filed: Aug. 27, 1981

[51] Int. Cl.³ .............................................. H01J 40/14
[52] U.S. Cl. ................................. 250/214 A; 307/311; 330/288; 330/308; 354/465; 356/226
[58] Field of Search ........ 250/214 P, 214 A, 214 AL, 250/214 RC; 307/311; 354/50, 51, 60 R, 60 E; 356/225, 226; 330/288, 59, 308

[56] References Cited
U.S. PATENT DOCUMENTS

| | | | |
|---|---|---|---|
| 3,418,592 | 12/1968 | Solomon et al. | 330/23 |
| 3,621,562 | 11/1971 | Patel | 29/577 |
| 3,822,387 | 7/1974 | Mulder | 330/288 X |
| 3,850,809 | 11/1974 | Mannonen | 250/214 A |
| 4,085,411 | 4/1978 | Genesi | 354/51 |
| 4,092,611 | 5/1978 | Frederiksen et al. | 250/214 A X |
| 4,118,621 | 10/1978 | Monticelli et al. | 250/214 A |

*Primary Examiner*—David C. Nelms
*Assistant Examiner*—Edward P. Westin

[57] ABSTRACT

In a silicon integrated circuit there is formed a silicon photo-diode connected to the input of a multiple stage current-mirror amplifier. The output branch of the amplifier is connected between the two power supply terminals. When voltage is applied to the two power supply terminals the current that flows is the sum of the currents in each branch of the three stage amplifier. Since each branch current is proportional to the current "generated" by the photo-diode, the total power supply current is proportional to the ambient light intensity. Thus a small two terminal photo-conductor type sensor is made that exhibits an unusually high sensitivity that is stable with temperature.

7 Claims, 5 Drawing Figures

U.S. Patent  Mar. 27, 1984  4,439,673
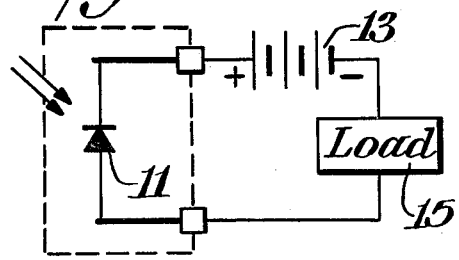
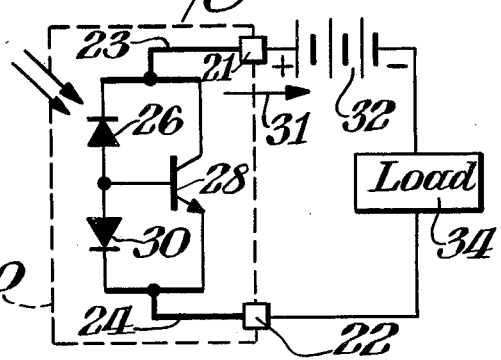
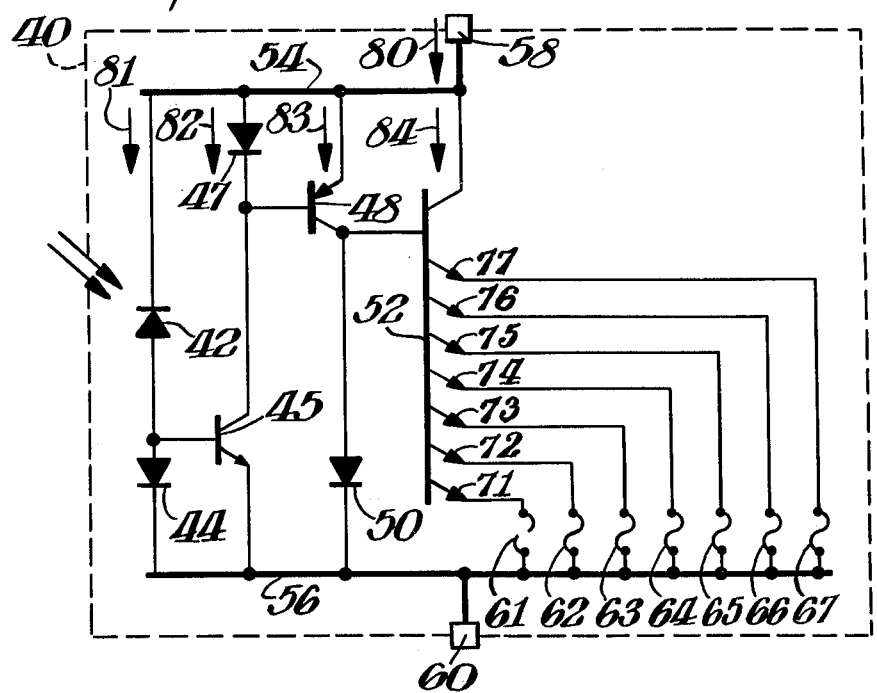
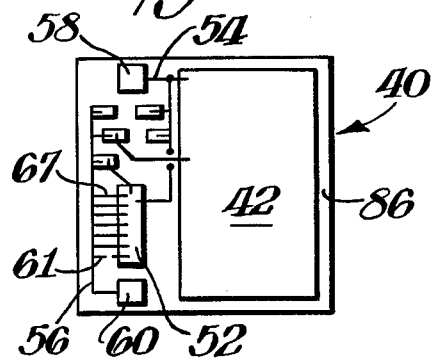
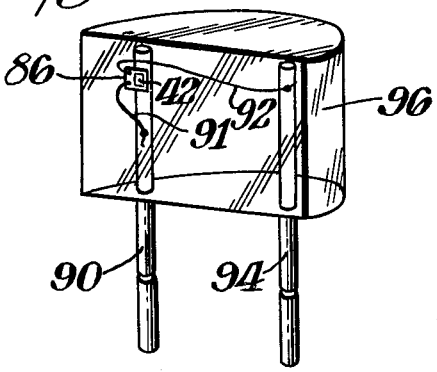

TWO TERMINAL INTEGRATED CIRCUIT LIGHT-SENSOR

BACKGROUND OF THE INVENTION

This invention relates to light sensors and more particularly to an integrated circuit light sensor having essentially only two terminals and exhibiting a high photo-conductivity sensitivity that is stable with temperature.

Photo-diodes with two terminals, have long been known to exhibit photo-conductivity. Silicon diodes are known to provide low photo conductive sensitivity but are quite stable with temperature. On the other hand, photo-sensors made of cadmium sulfide are know to have much higher sensitivities that are much more subject to change as a function of temperature.

The integration of silicon photo-diodes with an amplifier in a unitary silicon integrated circuit has helped to realize a high sensitivity light-to-current transducer that offers a stability with temperature comparable to that of a simple silicon photo-diode. Such an integrated circuit employing a current-mirror amplifier is described by R. Genesi in U.S. Pat. No. 4,085,411 issued Apr. 18, 1978 and is assigned to the same assignee as the present invention. The output of the amplifier is taken as the collector of the output transistor that is in turn connected through a load to a DC supply buss. The load is typically another portion of the same integrated circuit and/or an external integrating capacitor.

It is an object of this invention to provide a two terminal photo-sensor, of the photo-conductor type, having a greater but similarly stable sensitivity to that of a simple silicon photo-diode.

It is a further object of this invention to provide such a two terminal photo-sensor having a sensitivity adjustment means for providing sensors of precisely predetermined sensitivity.

SUMMARY OF THE INVENTION

A light sensor, of the photo-conductor type, is comprised of a silicon integrated circuit consisting essentially of a pair of terminal pads, a photo-diode, a current-mirror amplifier and a conductive buss means for delivering electrical energy to the photo-diode and to the amplifier from the pair of terminal pads, for connecting the photo-diode to the input of the current-mirror amplifier and for short circuiting the output of the amplifier.

This invention recognizes the principle that at any instant, the magnitude of the current flowing in each of the input and output branches of every stage in a current-mirror amplifier is proportional to the amplifier input current. Thus the sum of these currents that appears at the two power supply terminals is a proportional measure of the input current. When the input current is supplied from a back biased silicon photo-diode, the whole circuit itself behaves like an abnormally high sensitivity silicon photo-diode whereby the supply current is proportional to the ambient light intensity and independent of the voltage applied.

Furthermore, by providing a segmented emitter in a transistor of the amplifier, and by providing separate conductive links to each emitter segment such that one or more of the links can be interrupted e.g. by laser cutting, the current-gain of the amplifier may be custom adjusted to nearly a predetermined value.

Thus, to the unique combination of high stable sensitivity and small size, characterizing integrated circuit photo sensors of this invention, there also may be added a more precisely predetermined sensitivity.

BRIEF DESCRIPTION OF THE DRAWING

FIG. 1 shows a circuit diagram representing a two terminal photo-diode-sensor 11 powered from a battery 13 and series connected with a load 15.

FIG. 2 shows a circuit diagram of a two terminal integrated circuit light-sensor of this invention also connected to an electrical energy source and a load.

FIG. 3 shows a circuit diagram of another two terminal integrated circuit light sensor of this invention including a sensitivity adjustment means.

FIG. 4 shows the integrated circuit 40 of FIG. 3 formed in a silicon die.

FIG. 5 shows the integrated circuit chip incorporated in a large standard photo-sensor package.

DESCRIPTION OF THE PREFERRED EMBODIMENTS

An integrated circuit 20, indicated by a broken line in FIG. 2, includes two terminals 21 and 22, DC supply busses 23 and 24, a photo-diode 26 and a single stage current-mirror amplifier made up of transistor 28 and diode 30. The photo-diode 26 is connected to the input of the current-mirror amplifier. The current gain is almost exactly equal to the ratio of the base-emitter-junction area of output transistor 28 and the junction area of diode 30. Thus for example, when the amplifier gain is 2, then the current in the collector of the output transistor 28 is twice that flowing in the back-biased photo-diode 26. Thus the current 31 flowing through the terminals 21 and 22 (to the battery 32 and series connected load 34), is equal to three times the current flowing through photo-diode 26.

The load 34 may be a DC ammeter, in which case the system illustrated by FIG. 2 becomes a light meter.

Of course, the load 34 may be any current sensing apparatus such as that employed in motion detectors for security alarms. The two terminal integrated circuit light detector 20 may thus serve any purpose for which there can be used a simple two leaded photo-diode.

Referring to FIG. 3, there is illustrated an integrated circuit 40 that includes a photo-diode 42 and a three stage current-mirror amplifier made up of in the first stage diode 44 and transistor 45, in the second stage diode 47 and transistor 48 and in the third stage diode 50 and transistor 52. The circuit is connected so that DC power is applied to the photo-diode and amplifier via busses 54 and 56 from the two terminals (or integrated circuit terminal pads) 58 and 60.

The output transistor 52 has seven emitters, although as will be seen, this number may be smaller or greater as the circumstances require. Conductive links 61 through 67 are originally formed each to connect one of the emitters of transistor 52 to the buss 56. The sum of the base-emitter junction areas of transistor 52 relative to the junction area of diode 50 determines the current gain of the last amplification stage. If for example, the base-emitter junction areas associated with each emitter of transistor 52 are equal to each other, then an interruption of any one of the links, e.g. 61, will reduce the current gain of the last stage by a factor of 1/7 or 14%.

Alternatively, emitters 71 through 77 preferably have associated junction areas that are not equal, but rather increase in size in the relative ratios, 1, 2, 4, 8, 16, 32, and 64. In this case, the gain of the last stage may be adjusted downward in increments of 0.79% to 100% by interrupting proper combinations of the links 61–67.

It will also be noted that the integrated circuit power supply current 80 is the sum of the photo-diode current 81, the first stage output current 82, the second stage output current 83 and the last stage output current 84. Thus if each stage has a gain of 10, the overall gain, $I_{80}/I_{81}$ is 1,111. That is to say, the sensitivity of the integrated circuit sensor 40 is 1,111 times that of the photo-diode 42.

In FIG. 4, the integrated circuit 40 of FIG. 3 is formed in a silicon die 86 and the components thereof are designated by the same numerals. The photo-diode 42 measures 48 by 70 mils (1.2 by 1.8 mm) and the die 86 has the dimensions of $80 \times 80$ mils ($2 \times 2$ mm). The sensitivity of the silicon diode is about 35 nanoamps per foot candle, which is orders of magnitude lower than other photo conductors such as those of the cadmium sulfide type. A silicon photo-sensor of the present invention, however, may have a comparably high sensitivity while at the same time exhibiting a much smoother sensitivity vs. temperature characteristic. In addition to possessing high stability, this integrated circuit light sensor may be precisely adjusted to a predetermined sensitivity.

Adjustment of the light sensitivity is most easily accomplished using a laser to cut and interrupt appropriate of the links 61 and 67. This can be done automatically at a testing station designed to make probe contact with terminal pads 58 and 60 of each die 86 of a silicon wafer (not shown) prior to separating the die 86 from the wafer. By illuminating the die 86 with a known intensity of light and measuring the current (80 in FIG. 3) flowing through the electrified sensor, identification of the links that must be interrupted to achieve a predetermined sensor sensitivity is easily calculated from a knowledge of the number of output transistor emitters or links and the gain-determining junction-area ratios in that amplifier stage. Such a decision may be made for each die by a microprocesser that will direct the cutting of the links. The very small photo-sensors of the kind depicted in FIG. 4 will be useful in camera light control systems, hidden intrusion or motion detection alarm systems and in matrices of light sensors intended for pattern recognition applications. These are typical of uses that require a small size and may benefit from a precisely known sensitivity.

This integrated circuit chip 40 may also be incorporated in a large standard photo-sensor package as shown in FIG. 5. The chip 40 is physically but insulatively bonded to a lead wire 90. One of the termination pads (e.g. 60) is then thermocompression welded to a gold wire 91 that is connected also to the lead wire 90. Another fine gold wire 92 makes electrical connection between the other terminal pad (e.g. 58) and the other lead wire 94. This assembly is then encapsulated by casting in a transparent plastic to form a protective housing 96. The height and width of the housing 96 is typically about 480 mm and the diameter of lead wires is 0.

What is claimed is:

1. An integrated circuit light sensor comprising a die portion of a silicon wafer having formed thereat (a) a pair of terminal conductors; (b) a photo-diode; (c) a current-mirror amplifier; and (d) a conductive buss means for delivering electrical energy to said photo-diode and to said amplifier from said pair of terminal conductors, for connecting said photo-diode to the input of said current-mirror amplifier and for connecting the output branch of said current-mirror amplifier directly between said terminal conductors so that from said pair of terminal conductors said integrated circuit light sensor behaves like a simple photo-diode that may have an unusual combination of small size and a high stable sensitivity.

2. The integrated circuit light sensor of claim 1 wherein said amplifier is comprised of a plurality of current-mirror stages connected in tandem capable of providing an overall current gain.

3. The integrated circuit light sensor of claim 1 wherein at least one transistor of said amplifier has a plurality of emitters and said buss means includes a plurality of interruptible conductive links each connecting one of said emitters to one of said terminal conductors.

4. The integrated circuit light sensor of claim 3 wherein at least one of said links is interrupted, the remainder of said links providing a conductive connection between the corresponding of said emitters and said one terminal conductor.

5. The integrated circuit light sensor of claim 1 wherein each of said pair of terminal conductors is a conventional bonding pad to provide electrical access to said integrated circuit.

6. The integrated circuit light sensor of claim 1 additionally comprising a housing and only two electrical terminals affixed to said housing, said die portion being enclosed in said housing and said pair of terminal conductors of said die portion being connected respectively to said two housing terminals.

7. A silicon-integrated-circuit light sensor consisting essentially of two terminal pads, a multistage current-mirror amplifier having at least three stages and a photo diode that is series connected to the input branch of the first stage of said current-mirror amplifier, the output branch of each stage and the input branch of the succeeding stage of said current-mirror amplifier being series connected to form a common branch; said series connected photo diode and first stage input branch, said common branches and the output branch of the last output stage all being directly connected between said two terminal pads to form a two-terminal photo sensor of high sensitivity and small size.

* * * * *